United States Patent [19]

Canning

[11] 3,938,059

[45] Feb. 10, 1976

[54] SOLID STATE RECTIFIER CONTROL UNIT

[75] Inventor: Bernard Canning, Birmingham, England

[73] Assignee: Lodge-Cottrell Limited, Birmingham, England

[22] Filed: Aug. 21, 1974

[21] Appl. No.: 499,367

[30] Foreign Application Priority Data

Aug. 23, 1973 United Kingdom............... 39956/73

[52] U.S. Cl.............. 331/111; 307/305; 323/22 SC; 331/75

[51] Int. Cl.$^2$......................... H03K 3/26; H03K 3/35

[58] Field of Search.......... 331/111, 74, 75; 55/105, 55/139; 307/305; 323/22 SC; 321/45 DT

[56] References Cited

UNITED STATES PATENTS

| | | | |
|---|---|---|---|
| 3,351,776 | 11/1967 | Chin | 331/111 X |
| 3,688,220 | 8/1972 | Gay | 331/111 |

*Primary Examiner*—Siegfried H. Grimm
*Attorney, Agent, or Firm*—William E. Johnson, Jr.; John N. Hazelwood

[57] ABSTRACT

A circuit for controlling the rectifier circuit in an electrostatic dust precipitator, the circuit being an oscillator circuit utilising a pair of alternately conducting transistors and a timing circuit controlling conduction of one of the transistors, the other transistor controlling the circuit output.

3 Claims, 3 Drawing Figures

SOLID STATE RECTIFIER CONTROL UNIT

This invention is concerned with improvements in and relating to rectifier control units, especially such units for use in controlling an electrostatic dust precipitator.

It is an object of the present invention to provide an oscillator circuit for use in a rectifier control circuit.

It is a further object of the present invention to provide an improved rectifier control circuit.

The present invention is an oscillator circuit comprising a pair of parallel connected alternately conducting transistors, a capacitor timing circuit controlling the conduction of one of said transistors and a switching transistor whose conductive state is controlled by the other of said transistors.

Figure 1:
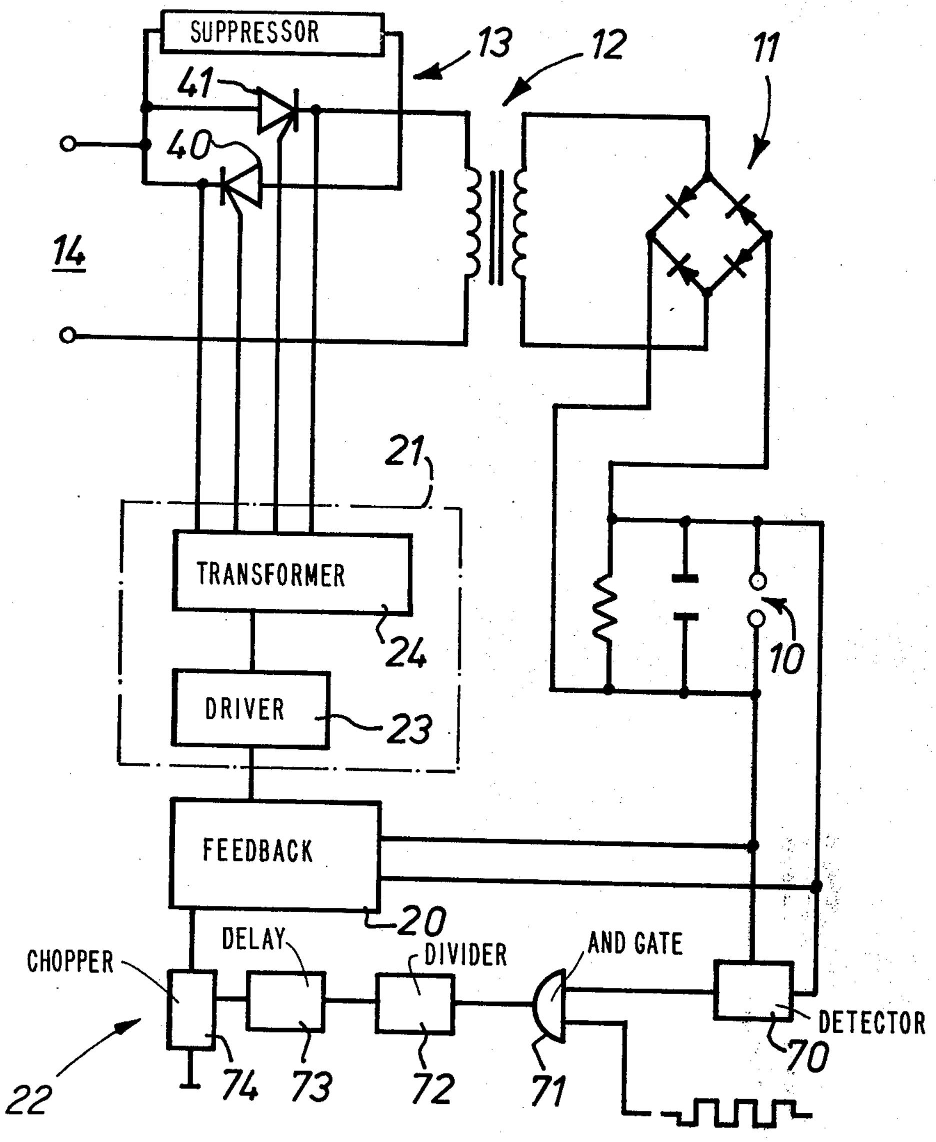
Figure 3:
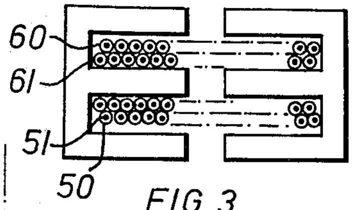
Figure 2:
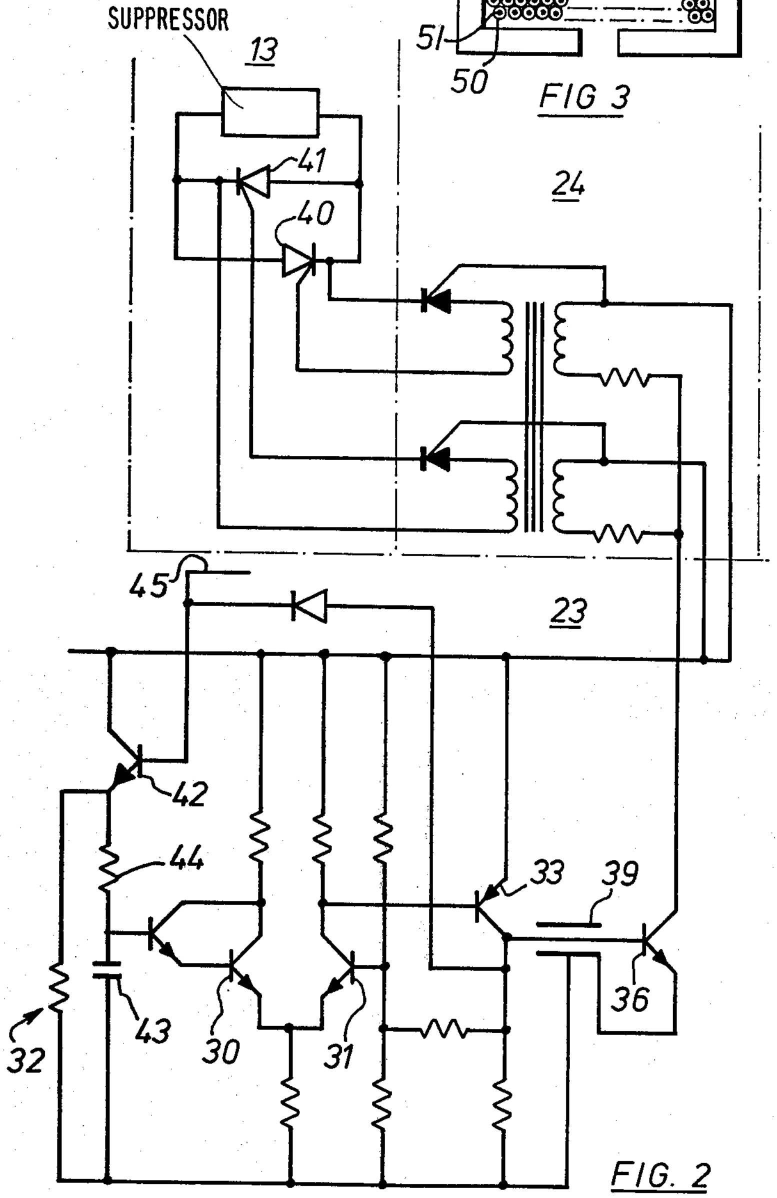

An embodiment of the present invention will now be described, by way of example, with reference to the accompanying drawings in which:

FIG. 1 diagrammatically illustrates the electrical supply circuit for an electrostatic dust precipitator;

FIG. 2 is a circuit diagram of the rectifier and rectifier control circuits of FIG. 1; and FIG. 3 illustrates the construction of a transformer utilised in FIG. 2.

Referring now to FIG. 1, an electrostatic dust precipitator is schematically illustrated by a spark gap 10 and is supplied from a bridge rectifier circuit 11. The rectifier circuit 11 in turn is supplied through a transformer 12 and thyristor circuit 13 from supply terminals 14.

The optimum voltage across the gap 10 is maintained by a feedback loop comprising a feedback circuit 20 which senses variations in the voltage at the gap 10 and seeks to maintain that voltage at an optimum value by controlling a thyristor control circuit 21 and thereby adjusting firing periods of the thyristors in the circuit 13. The thyristor control circuit comprises a driver circuit 23 and an output transformer 24.

A bypass circuit 22 is provided in parallel with the feedback circuit 20 for the purpose of interrupting normal operation of the feedback loop during sparking to protect the precipitators electrode assembly against excessive spark damage. The bypass circuit 22 comprises a detector 70, in this embodiment a Schmitt trigger, which provides an output pulse to one input of an AND gate 71 when the electrode voltage drops below a threshold level indicative of sparking. The second input to the AND gate is a square wave train at mains frequency and the output of the AND gate 71 passes through a divider 72 and a variable delay gate 73 to a chopper 74 connected to the feedback circuit 20, to produce at the output of the feedback circuit 20 an inhibit signal as will be later described. The divider 72 provides an output after four consecutive input pulses and the bypass circuit 22, thus operates to detect sparking that persists for four mains cycles and then inhibits or interrupt the power supply to the precipitator for a period determined by the variable delay gate 73. In this way undue spark damage to the electrode assembly is avoided.

The thyristor control circuit and the thyristor circuit are shown in more detail in FIG. 2. The driver circuit 23 comprises a pair of parallel connected transistors 30 and 31, a timing circuit 32 controlling the conduction of the transistor 31 and a switching transistor 33 whose conductivity is controlled by the transistor 31. The switching transistor has its collector connected through a coaxial cable 39 to the base of a power transistor 36 whose emitter-collector circuit is connected in series with two parallel connected primary windings of the output transformer 24. The secondary windings of the transformer 24 are connected to supply trigger pulses to the two thyristors 40 and 41 of the circuit 13.

The timing circuit 32 includes a transistor 42 supplying a capacitor 43 resistor 44 timing combination, the base of the transistor 42 being connected through a diode to the collector of the switching transistor 33. A further input 45 is provided to the base of the transistor 42 and is concerned with control of the driver circuit by the feedback circuit 20 as will be described hereinafter.

It should also be noted that while the transistor 30 has been referred to as a single transistor, as indeed it could be, as indeed it is in this embodiment a conventionally interconnected transistor pair.

To consider the operation of the thyristor control circuit consider firstly that capacitor 43 in the timing circuit 32 is discharged so that the transistor combination 30 is non-conducting, the transistor 31 is conducting so that the switching transistor 33 is also conducting.

The capacitor 43 in the timing circuit 32 commences charging through the conducting transistor 42 until the potential at the base of the first transistor of the transistor pair 30 rises to the level at which the pair 30 become conductive. This abruptly switches off the transistor 31 and thus the switching transistor 33. This causes the voltage at the collector of the transistor 33 to fall abruptly thus switching off the transistor 42 and allowing the capacitor 43 to discharge. With discharge of the capacitor 43 the potential at the base of the first transistor of the pair 30 falls until the pair 30 becomes non-conductive and the above process reverses. It is clear that the circuit so far described functions simply as an oscillator having a frequency and pulse/space durations determined by the time constants of the charging and discharging circuits of the capacitor in the timing circuit.

The feedback circuit 20 comprises a circuit which provides an analogue voltage proportional to the desired precipitator voltage (see for example my copending patent application Ser. No. 512,575, filed Oct. 7, 1974, which is a continuation-in-part application of Ser. No. 415,592, filed Nov. 14, 1973) and this analogue voltage is compared with a mains phase reference voltage to produce an inhibit signal unless the analogue voltage is greater than the phase reference voltage. The inhibit signal applied to the input 45 at the base of the transistor 42, inhibits operation of the oscillator. Thus the oscillator oscillates only for that portion of each mains half cycle in which the analogue voltage is greater than the reference voltage.

The operation of the rest of the thyristor control circuit is straightforward. The power transistor 36, acting as a power switch, conducts synchronously with the switching transistor 33 and the pulses through the transformer 24 energise the thyristors 40 and 41.

In the circumstances of use, however, it is desirable to have minimum inductance in the thyristor control circuit and it is for this reason that the connection between the switching transistor 33 and the power transistor 36 is through a coaxial cable 39 as this minimises inductance and allows the power transistor 36 and the output transformer 24 to be physically located close to the thyristor circuit 13. A further precaution is taken in this respect in the design of the transformer 24 in that, as indicated in FIG. 3, each combination 60 and 61 of a primary and a secondary winding is formed by coaxial conductors 50 and 51 thus minimising inductance.

I claim:

1. A rectifier control circuit comprising a transformer having a primary winding and a secondary winding, a thyristor having anode and gate electrodes connected to the secondary winding and an oscillator coupled with the transformer primary winding, the oscillator comprising a pair of parallel connected alternately conducting transistors, a switching transistor connected with and controlling the energization of the primary winding, the conductive state of the switching transistor being controlled by one of said transistors, and a capacitor timing circuit controlling the conduction of the other of said transistors, the timing circuit comprising a capacitor connected in series with a charging transistor and in parallel with a discharge circuit, the base of said charging transistor being connected to said switching transistor whereby the conductive state of the switching transistor determines the conductive state of the charging transistor.

2. A rectifier control circuit as claimed in claim 1, in which the switching transistor is connected with the primary winding through a coaxial cable.

3. A rectifier control circuit as claimed in claim 1, including a power swith controlled by said switching transistor and connected with the primary winding to control the energization thereof.

* * * * *